US 10,827,604 B2

(12) United States Patent
Okunaga et al.

(10) Patent No.: US 10,827,604 B2
(45) Date of Patent: Nov. 3, 2020

(54) METHOD FOR PRODUCING HIGH FREQUENCY CIRCUIT BOARD, AND HIGH FREQUENCY CIRCUIT BOARD

(71) Applicant: NIPPON PILLAR PACKING CO., LTD., Osaka (JP)

(72) Inventors: Takeshi Okunaga, Osaka (JP); Akira Nakatsu, Osaka (JP); Kojiro Iwasa, Osaka (JP); Yusuke Natsuhara, Osaka (JP)

(73) Assignee: NIPPON PILLAR PACKING CO., LTD., Osaka (JP)

( * ) Notice: Subject to any disclaimer, the term of this patent is extended or adjusted under 35 U.S.C. 154(b) by 0 days.

(21) Appl. No.: 16/459,968

(22) Filed: Jul. 2, 2019

(65) Prior Publication Data

US 2020/0260572 A1    Aug. 13, 2020

(30) Foreign Application Priority Data

Feb. 12, 2019    (JP) ................. 2019-022801

(51) Int. Cl.
*H05K 1/18* (2006.01)
*H05K 1/02* (2006.01)
(Continued)

(52) U.S. Cl.
CPC ......... *H05K 1/0243* (2013.01); *H01Q 1/3233* (2013.01); *H05K 1/024* (2013.01);
(Continued)

(58) Field of Classification Search
CPC ...... H05K 1/182; H05K 1/183; H05K 1/0231; H05K 3/3494; H05K 3/305; H05K 3/3405;
(Continued)

(56) References Cited

U.S. PATENT DOCUMENTS 6,852,049 B2 * 2/2005 Markley ............... F16H 7/0848
474/109
10,141,658 B2  11/2018 Yamamoto et al.
(Continued)

FOREIGN PATENT DOCUMENTS

JP    2017-215197 A    12/2017

OTHER PUBLICATIONS

English Abstract of JP 2017-215197 A published Dec. 7, 2017.

*Primary Examiner* — Steven T Sawyer
(74) *Attorney, Agent, or Firm* — Millen, White, Zelano & Branigan, P.C.; William Nixon

(57) ABSTRACT

A method for producing a high frequency circuit board includes forming an antenna pattern on an upper surface of the provisional substrate. The method includes performing hot-press in a state where a thermoplastic resin and a provisional conductor are stacked on the upper surface of the provisional substrate, to form a first dielectric layer portion covering the antenna pattern. The method includes removing the provisional conductor and shaving the first dielectric layer portion to form a cavity to house an electronic component. The method includes mounting the electronic component on the antenna pattern in the cavity. The method includes performing hot-press in a state where a thermosetting resin and a ground conductor are stacked at an opening side of the cavity in the first dielectric layer portion, to form a second dielectric layer portion to embed the electronic component in the cavity. The method includes removing the provisional substrate.

8 Claims, 11 Drawing Sheets

(51) Int. Cl.
*H01Q 1/32* (2006.01)
*H05K 3/46* (2006.01)
*H05K 1/11* (2006.01)

(52) U.S. Cl.
CPC ........... *H05K 1/0242* (2013.01); *H05K 1/111* (2013.01); *H05K 3/4652* (2013.01); *H05K 3/4697* (2013.01); *H05K 2201/10098* (2013.01); *H05K 2203/1105* (2013.01)

(58) Field of Classification Search
CPC . H05K 2201/10015; H05K 2203/0156; H05K 2203/1394; H05K 1/184; H05K 1/185; H05K 1/0243; H05K 1/0242; H05K 1/111; H05K 1/024; H05K 3/4652; H05K 3/4697; H05K 2201/10098; H05K 2203/1105; H05K 1/0271; H05K 2201/10674; H01Q 1/3233; H01L 24/00; H01L 23/5389; H01L 24/19; H01L 23/48; H01L 23/49816; H01L 23/50; H01L 2224/18; H01L 2924/3025; H01L 2924/3511; H01L 2924/181; H01L 2924/00014; H01L 21/568; H01L 2224/04105; H01L 2224/12105; H01L 2224/16227; H01L 2224/24195; H01L 2224/32145; H01L 2224/32225; H01L 2224/48091; H01L 2224/48227; H01L 2224/73204; H01L 2224/73253; H01L 2224/73265; H01L 2225/0651; H01L 2225/06517; H01L 2225/1035; H01L 2225/1041; H01L 2225/1058; H01L 2924/15311; H01L 2924/19105; H01L 2225/06558
USPC ......................................................... 174/260
See application file for complete search history.

(56) References Cited

U.S. PATENT DOCUMENTS

| | | |
|---|---|---|
| 2005/0017347 A1* | 1/2005 | Morimoto ........... H01L 23/5389 257/703 |
| 2009/0188703 A1* | 7/2009 | Ito ..................... H01L 23/49838 174/255 |
| 2009/0301766 A1* | 12/2009 | Park ....................... H05K 1/185 174/255 |
| 2009/0310323 A1* | 12/2009 | Baek ..................... H05K 1/185 361/784 |
| 2012/0080221 A1* | 4/2012 | Sekine ................... H05K 1/186 174/260 |
| 2014/0049928 A1* | 2/2014 | Sawatari ................. H01L 24/19 361/762 |
| 2015/0016078 A1* | 1/2015 | Yang .................... H05K 1/0224 361/762 |
| 2015/0364816 A1* | 12/2015 | Murugan ................ H01L 23/66 343/905 |
| 2016/0338202 A1* | 11/2016 | Park ....................... H01L 24/00 |
| 2017/0301636 A1* | 10/2017 | Tong ....................... H01L 23/60 |
| 2017/0346195 A1 | 11/2017 | Yamamoto et al. |
| 2018/0076155 A1* | 3/2018 | Bihler ..................... H01P 3/121 |

* cited by examiner

METHOD FOR PRODUCING HIGH FREQUENCY CIRCUIT BOARD, AND HIGH FREQUENCY CIRCUIT BOARD

TECHNICAL FIELD

The present invention relates to a method for producing a high frequency circuit board, and a high frequency circuit board.

BACKGROUND ART

As a high frequency circuit board for use in a radar sensor device such as a millimeter wave radar mounted on an automobile, a high frequency circuit board having an electronic component such as an IC mounted on the surface of a board body having a high frequency circuit pattern is known (see FIG. 1 and FIG. 2 of PATENT LITERATURE 1). In recent years, with size reduction of electronic equipment, size reduction of a high frequency circuit board has been required. As a countermeasure for this requirement, the mounting area of an electronic component on the surface of a board body is reduced by embedding the electronic component in a dielectric layer of the board body. When producing such a high frequency circuit board, an electronic component is mounted on a substrate, and then an epoxy resin dielectric is hot-pressed on the substrate at a low temperature (220° C.), whereby a dielectric layer having the electronic component embedded therein is formed.

CITATION LIST

Patent Literature

PATENT LITERATURE 1: Japanese Laid-Open Patent Publication No. 2017-215197

SUMMARY OF INVENTION

Technical Problem

As the dielectric of the board body in the above high frequency circuit board, use of a thermoplastic resin such as a fluorine resin which has better high frequency characteristics than an epoxy resin is under consideration. However, in the case of using a thermoplastic resin as the dielectric, there is a problem that the temperature becomes excessively high (350° C. or higher) when hot-pressing the thermoplastic resin on the substrate having an electronic component mounted thereon, so that the electronic component cannot withstand the heat and is damaged.

In view of the above conventional problem, an object of the present invention is to provide a small-sized high frequency circuit board having improved high frequency characteristics while inhibiting thermal damage to an electronic component.

Solution to Problem (1) The present invention is directed to a method for producing a high frequency circuit board, the method including, in this order: a first step of forming a high frequency circuit pattern on one surface of a provisional substrate; a second step of performing hot-press in a state where a thermoplastic resin and a provisional conductor are stacked in this order on the one surface of the provisional substrate, to form a first dielectric layer portion covering the high frequency circuit pattern, from the thermoplastic resin; a third step of removing the provisional conductor and then performing shaving on the first dielectric layer portion to form a cavity that allows an electronic component to be housed therein; a fourth step of mounting the electronic component on the high frequency circuit pattern in the cavity; a fifth step of performing hot-press in a state where a thermosetting resin and a ground conductor are stacked in this order at an opening side of the cavity in the first dielectric layer portion, to form a second dielectric layer portion in which the electronic component in the cavity is embedded, from the thermosetting resin; and a sixth step of removing the provisional substrate.

With the method for producing the high frequency circuit board of the present invention, the first dielectric layer portion is formed by hot-pressing the thermoplastic resin on the provisional substrate having the high frequency circuit pattern formed thereon, and then the electronic component is mounted on the high frequency circuit pattern in the cavity formed in the first dielectric layer portion. That is, since the thermoplastic resin is hot-pressed before the electronic component is mounted on the high frequency circuit pattern, thermal damage to the electronic component due to hot-pressing the thermoplastic resin at a high temperature can be inhibited.

Moreover, after the electronic component is mounted on the high frequency circuit pattern, the thermosetting resin and the ground conductor are hot-pressed from the opening side of the cavity in the first dielectric layer portion, to form the second dielectric layer portion in which the electronic component in the cavity is embedded, from the thermosetting resin. Accordingly, the second dielectric layer portion in which the electronic component is embedded and the first dielectric layer portion formed from the thermoplastic resin having good high frequency characteristics are interposed between the ground conductor and the high frequency circuit pattern. Thus, the size of the high frequency circuit board can be reduced, and the high frequency characteristics of the high frequency circuit board can also be improved.

(2) Preferably, in the fifth step, hot-press is performed such that a part of the second dielectric layer portion is formed between the ground conductor and a portion of the first dielectric layer portion excluding the cavity.

In this case, the ground conductor can be easily fixed to the first dielectric layer portion side by the part of the second dielectric layer portion formed from the thermosetting resin.

(3) Preferably, in the first step, a pad for connecting the electronic component is further provided at one portion on the high frequency circuit pattern; in the second step, the first dielectric layer portion that covers another portion on the high frequency circuit pattern and the pad is formed by hot-press; and, in the third step, the shaving is performed until the pad becomes exposed at a bottom of the cavity while the other portion on the high frequency circuit pattern is kept covered with the first dielectric layer portion.

In this case, even when shaving is performed on the first dielectric layer portion, the other portion on the high frequency circuit pattern is kept covered with the first dielectric layer portion, and thus the area on the high frequency circuit pattern that is covered with the first dielectric layer portion can be increased as compared to that in the case where the other part is not covered with the first dielectric layer portion. Thus, the high frequency characteristics can be further improved.

(4) According to another aspect, the present invention is directed to a high frequency circuit board including: a ground conductor; a high frequency circuit pattern disposed so as to be separated from one surface of the ground conductor; an electronic component mounted on the high frequency circuit pattern; and a dielectric layer interposed between the ground conductor and the high frequency circuit pattern, wherein the dielectric layer has a first dielectric layer portion having a cavity in which the electronic component is housed, the first dielectric layer portion being in non-contact with the electronic component, and a second dielectric layer portion that is formed at least in the cavity and in which the electronic component is embedded, the first dielectric layer portion is formed from a thermoplastic resin, and the second dielectric layer portion is formed from a thermosetting resin.

In the high frequency circuit board of the present invention, since the electronic component mounted on the high frequency circuit pattern is in non-contact with the first dielectric layer portion formed from the thermoplastic resin, the electronic component can be inhibited from being thermally damaged when hot-pressing the thermoplastic resin at a high temperature to form the first dielectric layer portion.

Moreover, the second dielectric layer portion in which the electronic component is embedded and the first dielectric layer portion formed from the thermoplastic resin having good high frequency characteristics are interposed between the ground conductor and the high frequency circuit pattern. Thus, the size of the high frequency circuit board can be reduced, and the high frequency characteristics of the high frequency circuit board can also be improved.

(5) Preferably, a part of the second dielectric layer portion is interposed between the ground conductor and a portion of the first dielectric layer portion excluding the cavity.

In this case, the ground conductor can be easily fixed to the first dielectric layer portion side by said part of the second dielectric layer portion formed from the thermosetting resin.

(6) Preferably, said part of the second dielectric layer portion has a thickness smaller than that of the first dielectric layer portion between the ground conductor and the high frequency circuit pattern.

In this case, the adverse effect of the thermosetting resin (said part of the second dielectric layer portion) on high frequency characteristics can be reduced.

(7) Preferably, the thermoplastic resin is a polytetrafluoroethylene (PTFE) resin.

In this case, a high frequency circuit board can be produced more easily at a lower cost than that with a tetrafluoroethylene/perfluoroalkyl vinyl ether copolymer (PFA) resin, which is a fluorine resin, and a high frequency circuit board having good high frequency characteristics can be produced more easily than that with a liquid crystal polymer (LCP).

(8) Preferably, the high frequency circuit pattern is an antenna pattern.

In this case, the size of the high frequency circuit board including the antenna pattern can be reduced, and the high frequency characteristics of the high frequency circuit board can also be improved.

(9) Preferably, the high frequency circuit board further includes a glass epoxy resin layer laminated on another surface of the ground conductor that is opposite to the one surface.

In this case, since the high frequency circuit board includes the glass epoxy resin layer, for example, a circuit (a base band part circuit, a power supply, etc.) required for a radar sensor device can be disposed, and thus size reduction can be achieved.

Advantageous Effects of Invention

According to the present invention, a small-sized high frequency circuit board having improved high frequency characteristics while inhibiting thermal damage to an electronic component can be provided.

DESCRIPTION OF EMBODIMENTS

Next, preferred embodiments of the present invention will be described with reference to the accompanying drawings.

First Embodiment

<Configuration of High Frequency Circuit Board>

Figure 1:
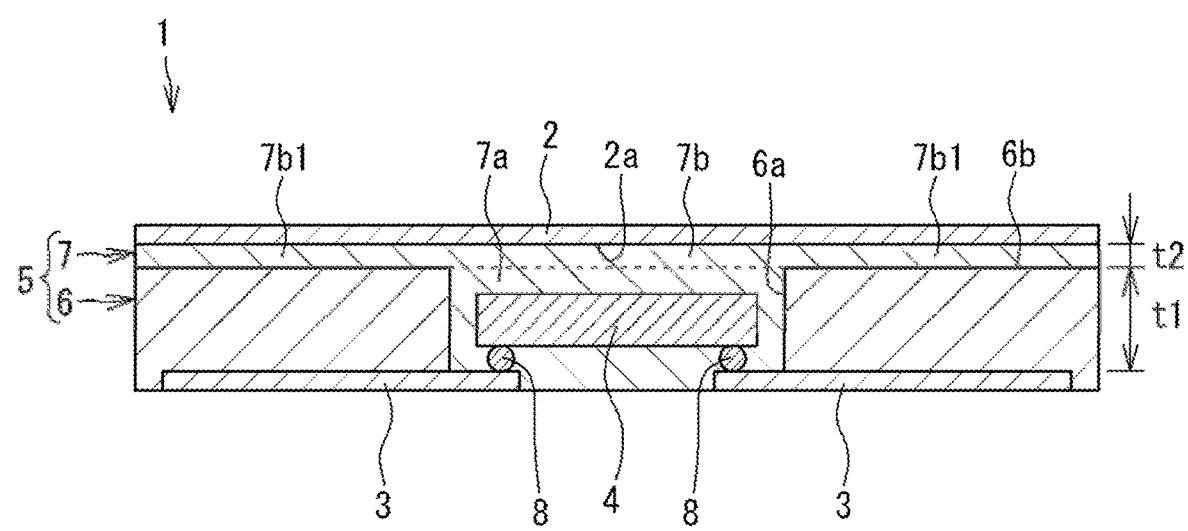
FIG. 1 is a cross-sectional schematic diagram showing a high frequency circuit board according to a first embodiment of the present invention.

FIG. 1 is a cross-sectional schematic diagram showing a high frequency circuit board according to a first embodiment of the present invention. The high frequency circuit board 1 is used, for example, in a radar sensor device such as a millimeter wave radar mounted on an automobile. The high frequency circuit board 1 of the present embodiment includes a ground conductor 2, an antenna pattern (high frequency circuit pattern) 3, an electronic component 4, and a dielectric layer 5. In the following description, the upper side of FIG. 1 is referred to as an "upper side" of the high frequency circuit board 1, and the lower side of FIG. 1 is referred to as a "lower side" of the high frequency circuit board 1 (the same applies to FIG. 2A to FIG. 11).

The ground conductor 2 is formed from a metal foil such as a copper foil and is disposed at the uppermost layer of the high frequency circuit board 1. The antenna pattern 3, which is a high frequency circuit pattern, is formed in a desired shape by performing etching on a metal foil such as a copper foil. In the present embodiment, a plurality of (two in the shown example) antenna patterns 3 are disposed at the lowermost layer of the high frequency circuit board 1 so as to be separated from the lower surface (one surface) of the ground conductor 2. It should be noted that the number of antenna patterns 3 may be only one. In addition, the high frequency circuit pattern is not limited to the antenna pattern.

Examples of the electronic component 4 include ICs (including an unpackaged IC), transistors, diodes, resistors, capacitors, etc. The electronic component 4 of the present embodiment is composed of, for example, a monolithic microwave integrated circuit (MMIC). The electronic component 4 is soldered and mounted on each antenna pattern 3 by a solder 8 in a state where the electronic component 4 is disposed so as to extend over each antenna pattern 3. The electronic component 4 may be mounted on each antenna pattern 3 by a method other than soldering.

Figure 4A:
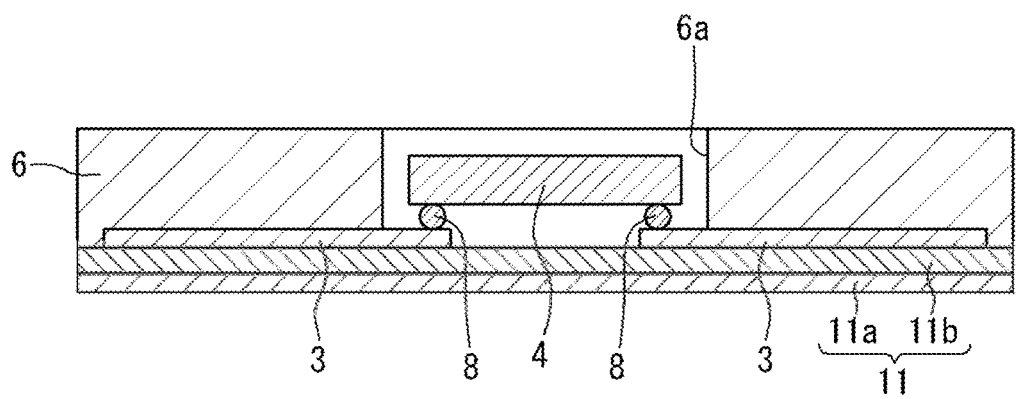
FIG. 4A is a cross-sectional schematic diagram showing a fourth step in the method for producing the high frequency circuit board.
Figure 4B:
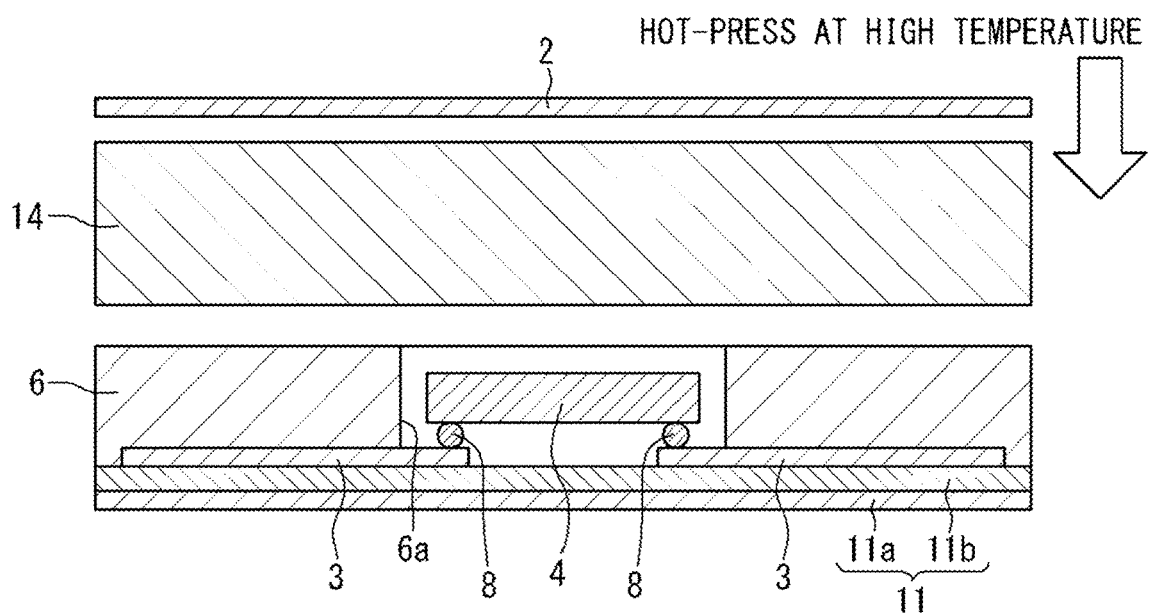
FIG. 4B is a cross-sectional schematic diagram showing a fifth step in the method for producing the high frequency circuit board.

The dielectric layer 5 is mainly interposed between the ground conductor 2 and each antenna pattern 3, and has: a first dielectric layer portion 6 that is formed by hot-pressing a thermoplastic resin 13 (see FIG. 2B); and a second dielectric layer portion 7 that is formed by hot-pressing a thermosetting resin 14 (see FIG. 4B).

Examples of the thermoplastic resin 13 include: fluorine resins such as polytetrafluoroethylene (PTFE) resins, tetrafluoroethylene/perfluoroalkyl vinyl ether copolymer (PFA) resins, polychlorotrifluoroethylene (PCTFE) resins, tetrafluoroethylene/hexafluoropropylene copolymer (FEP) resins, polyvinylidene fluoride (PVdF) resins, polyvinyl fluoride (PVF) resins, tetrafluoroethylene/ethylene copolymer (ETFE) resins, and chlorotrifluoroethylene/ethylene copolymer (ECTFE) resins; polyphenylene ether (PPE) resins; modified polyphenylene ether (modified PPE) resins; liquid crystal polymers (LCP); and polymer alloys of these substances. Examples of the thermosetting resin 14 include epoxy resins. In the present embodiment, a polytetrafluoroethylene resin is used as the thermoplastic resin 13, and an epoxy resin is used as the thermosetting resin 14.

A major part of the lower surface of the first dielectric layer portion 6 is in close contact with and fixed to the upper surfaces of the respective antenna patterns 3. The first dielectric layer portion 6 is also formed outside each antenna pattern 3 (at both left and right sides in FIG. 1), and the lower surfaces of the formed portions thereof are flush with the lower surface of each antenna pattern 3.

The first dielectric layer portion 6 has a cavity 6a having a bottom at which a part of each antenna pattern 3 is exposed. The cavity 6a is formed with a minimum necessary size that allows the electronic component 4 to be mounted on each antenna pattern 3 in a state where the electronic component 4 is housed in the cavity 6a. The first dielectric layer portion 6 is brought into non-contact with the electronic component 4 by the electronic component 4 being housed in the cavity 6a.

The second dielectric layer portion 7 has: an embedding portion 7a that is formed in the cavity 6a and in which the electronic component 4 is embedded; and a close contact portion 7b that is contiguously formed at the upper side of the embedding portion 7a and is in close contact with and fixed to the entirety of a lower surface 2a of the ground conductor 2.

The outer surface of the embedding portion 7a is in close contact with and fixed to the inner surface of the cavity 6a. In addition, an outer portion of the lower surface of the embedding portion 7a is in close contact with and fixed to the upper surfaces of the respective antenna patterns 3. An inner portion of the lower surface of the embedding portion 7a is formed between both antenna patterns 3, and the lower surface of the formed portion thereof is flush with the lower surface of each antenna pattern 3.

The lower surface of an outer portion 7b1 of the close contact portion 7b that extends outward of the embedding portion 7a is in close contact with and fixed to an upper surface 6b of a portion of the first dielectric layer portion 6 excluding the cavity 6a. Thus, a part (outer portion 7b1) of the second dielectric layer portion 7 is interposed between the upper surface 6b of the first dielectric layer portion 6 and the lower surface 2a of the ground conductor 2 and fixes the ground conductor 2 to the first dielectric layer portion 6 side. The outer portion 7b1 is formed such that a thickness t2 in a lamination direction (up-down direction in FIG. 1) of the outer portion 7b1 is smaller than a thickness t1 in the lamination direction of the first dielectric layer portion 6 between the ground conductor 2 and the antenna pattern 3.

<Method for Producing High Frequency Circuit Board>

FIG. 2A to FIG. 5 are cross-sectional schematic diagrams showing a method for producing the high frequency circuit board 1 of the first embodiment. Hereinafter, the method for producing the high frequency circuit board 1 will be described with reference to FIG. 2A to FIG. 5.

Figure 2A:
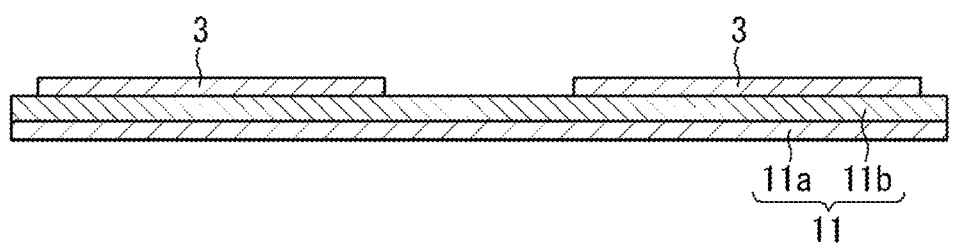
FIG. 2A is a cross-sectional schematic diagram showing a first step in a method for producing the high frequency circuit board.

In FIG. 2A, first, etching is performed on a metal foil laminated on the upper surface (one surface) of a provisional substrate 11, to form each antenna pattern 3 (a first step). The provisional substrate 11 is formed, for example, by laminating a nickel foil 11b on the upper surface of a copper foil 11a that is to be a base. The configuration of the provisional substrate 11 is not limited to the configuration of the present embodiment.

Figure 2B:
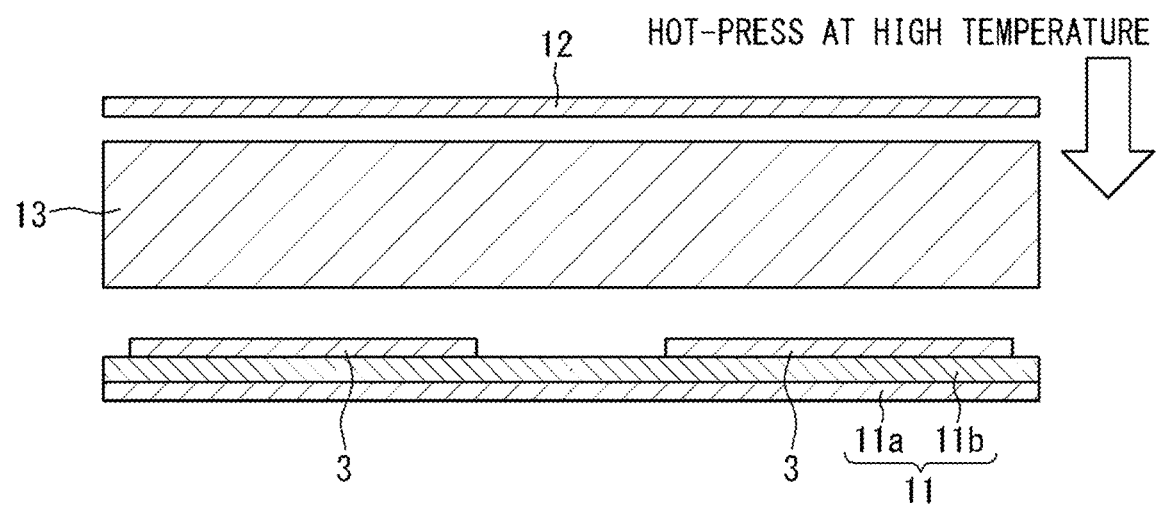
FIG. 2B is a cross-sectional schematic diagram showing a second step in the method for producing the high frequency circuit board.

Next, as shown in FIG. 2B, in a state where the thermoplastic resin 13 and a provisional conductor 12 are stacked in this order on the upper surface of the provisional substrate 11, hot-press is performed at a high temperature of 350° C. or higher. Accordingly, as shown in FIG. 3A, between the provisional substrate 11 and the provisional conductor 12, the first dielectric layer portion 6 that covers each antenna pattern 3 is formed from the thermoplastic resin 13 (a second step).

Figure 3A:
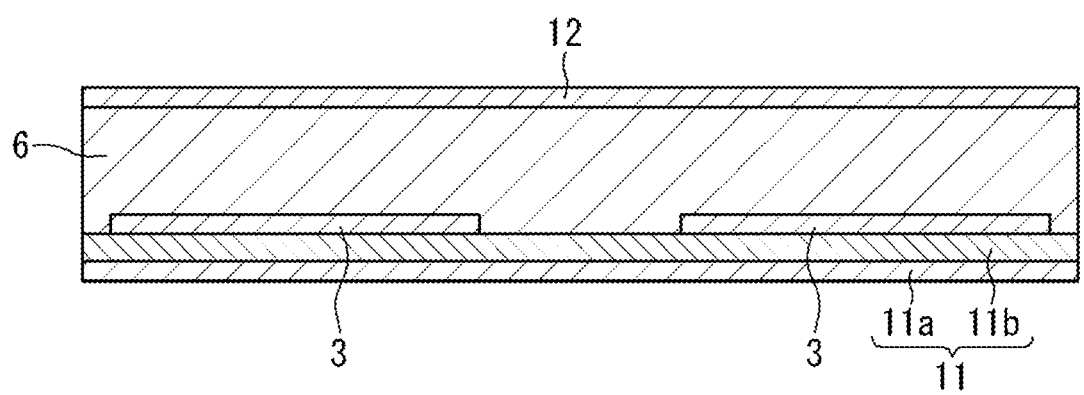
FIG. 3A is a cross-sectional schematic diagram showing the second step in the method for producing the high frequency circuit board.
Figure 3B:
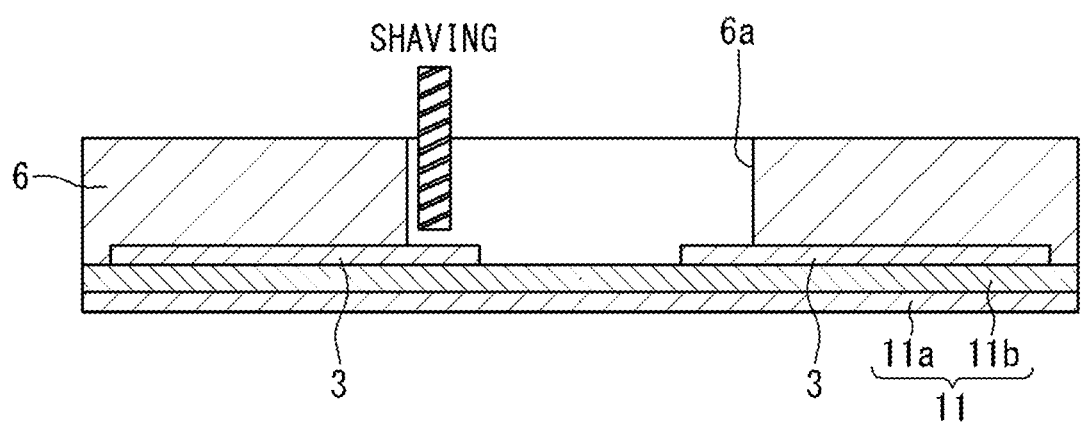
FIG. 3B is a cross-sectional schematic diagram showing a third step in the method for producing the high frequency circuit board.

Next, after the provisional conductor 12 is removed in the state shown in FIG. 3A, shaving is performed on the first dielectric layer portion 6 as shown in FIG. 3B, to form the cavity 6a that allows the electronic component 4 to be housed therein (a third step). Accordingly, a state where a part of each antenna pattern 3 is exposed at the bottom of the cavity 6a is obtained.

Next, as shown in FIG. 4A, in a state where the electronic component 4 is inserted into the cavity 6a of the first dielectric layer portion 6, the electronic component 4 is soldered to each antenna pattern 3 by the solder 8. Accordingly, the electronic component 4 is mounted on each antenna pattern 3 in a state where the electronic component 4 is in non-contact with the first dielectric layer portion 6 (a fourth step).

Next, as shown in FIG. 4B, in a state where the thermosetting resin 14 and the ground conductor 2 are stacked in this order at the opening side of the cavity 6a in the first dielectric layer portion 6, hot-press is performed at a low temperature of 220° C. (a fifth step). At this time, hot-press is performed such that a part of the thermosetting resin 14 is left between the upper surface 6b of the first dielectric layer portion 6 and the lower surface 2a of the ground conductor 2.

Figure 5:
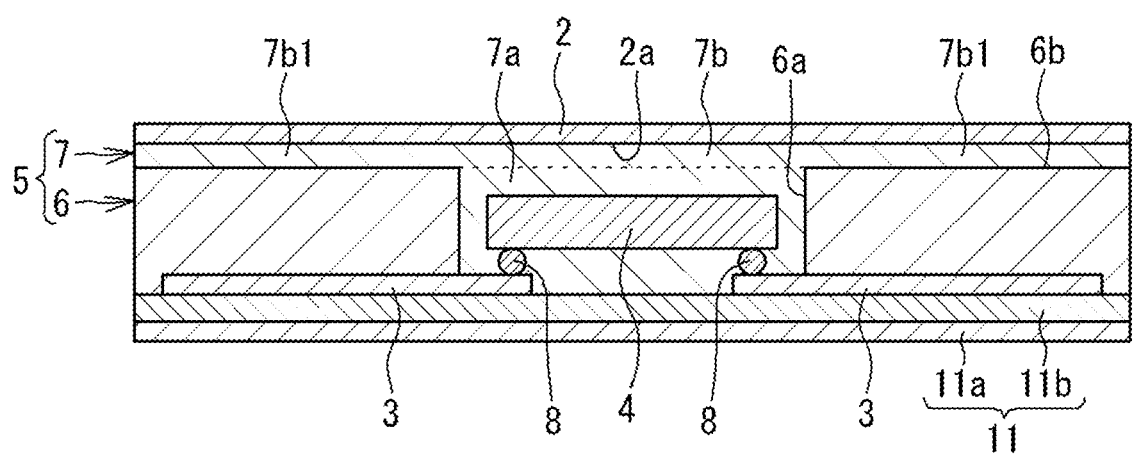
FIG. 5 is a cross-sectional schematic diagram showing the fifth step in the method for producing the high frequency circuit board.

Accordingly, as shown in FIG. 5, the second dielectric layer portion 7 that has the embedding portion 7a in which the electronic component 4 in the cavity 6a is embedded and the close contact portion 7b interposed between the upper surface 6b of the first dielectric layer portion 6 and the lower surface 2a of the ground conductor 2 is formed from the thermosetting resin 14. In the fifth step, one thermosetting resin 14 is used, but two thermosetting resins for the embedding portion 7a and for the close contact portion 7b may be used.

Next, the provisional substrate 11 is removed in the state shown in FIG. 5 (a sixth step). Accordingly, the high frequency circuit board 1 shown in FIG. 1 can be obtained.

Advantageous Effects

With the above-described method for producing the high frequency circuit board 1 of the first embodiment, the first dielectric layer portion 6 is formed by hot-pressing the thermoplastic resin 13 on the provisional substrate 11 having the antenna patterns 3 formed thereon, and then the electronic component 4 is mounted on the antenna patterns 3 in the cavity 6a formed in the first dielectric layer portion 6. That is, since the thermoplastic resin 13 is hot-pressed before the electronic component 4 is mounted on the antenna patterns 3, thermal damage to the electronic component 4 due to hot-pressing the thermoplastic resin 13 at a high temperature can be inhibited.

Moreover, after the electronic component 4 is mounted on the antenna patterns 3, the thermosetting resin 14 and the ground conductor 2 are hot-pressed from the opening side of the cavity 6a in the first dielectric layer portion 6, to form the second dielectric layer portion 7 in which the electronic component 4 in the cavity 6a is embedded, from the thermosetting resin 14. Accordingly, the second dielectric layer portion 7 in which the electronic component 4 is embedded and the first dielectric layer portion 6 formed from the thermoplastic resin 13 having good high frequency characteristics are interposed between the ground conductor 2 and the antenna pattern 3. Thus, the size of the high frequency circuit board 1 can be reduced, and the high frequency characteristics of the high frequency circuit board 1 can also be improved.

Moreover, when hot-pressing the thermosetting resin 14 and the ground conductor 2, hot-press is performed such that a part (outer portion 7b1) of the second dielectric layer portion 7 is formed between the upper surface 6b of the first dielectric layer portion 6 and the lower surface 2a of the ground conductor 2, and thus the ground conductor 2 can be easily fixed to the first dielectric layer portion 6 side by the part of the second dielectric layer portion 7 formed from the thermosetting resin 14.

Moreover, since the thickness t2 of the outer portion 7b1 of the second dielectric layer portion 7 is smaller than the thickness t1 of the first dielectric layer portion 6 between the ground conductor 2 and the antenna pattern 3, the adverse effect of the thermosetting resin 14 (the outer portion 7b1 of the second dielectric layer portion 7) on high frequency characteristics can be reduced.

Moreover, since a polytetrafluoroethylene (PTFE) resin is used as the thermoplastic resin 13, a high frequency circuit board can be produced more easily at a lower cost than that with a tetrafluoroethylene/perfluoroalkyl vinyl ether copolymer (PFA) resin, which is a fluorine resin, and a high frequency circuit board having good high frequency characteristics can be produced more easily than that with a liquid crystal polymer (LCP).

Second Embodiment

Figure 6:
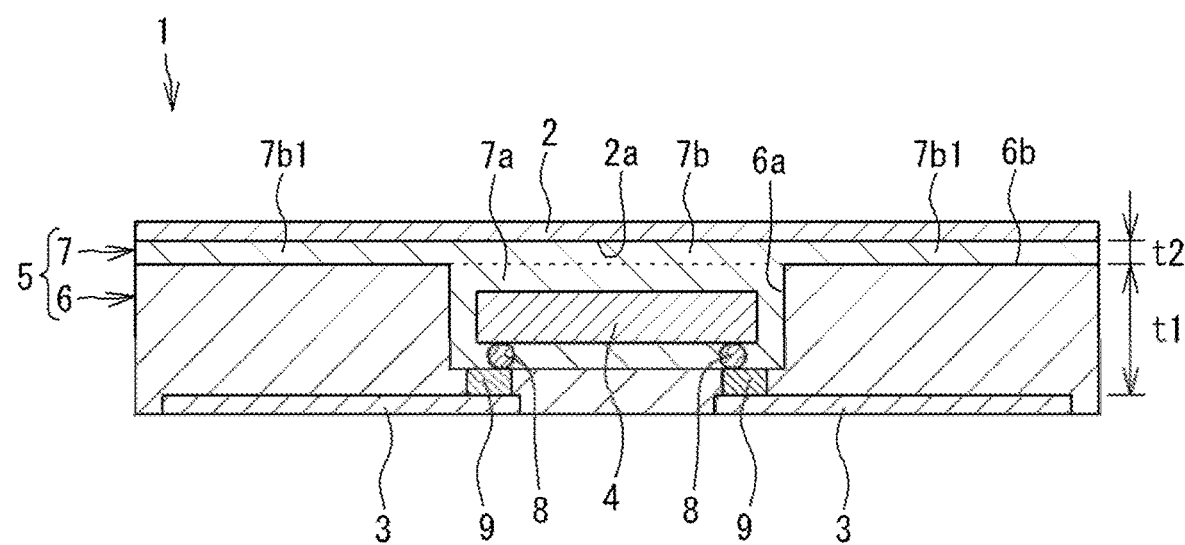
FIG. 6 is a cross-sectional schematic diagram showing a high frequency circuit board according to a second embodiment of the present invention.

FIG. 6 is a cross-sectional schematic diagram showing a high frequency circuit board according to a second embodiment of the present invention. In the high frequency circuit board 1 of the present embodiment, a pad 9 for connecting the electronic component 4 is provided on a part of each antenna pattern 3. Each pad 9 of the present embodiment is provided at a position, on the antenna pattern 3, corresponding to the cavity 6a.

The cavity 6a of the present embodiment is formed such that only the upper surface of each pad 9 is exposed at the bottom thereof. Thus, in the present embodiment, the entirety of each antenna pattern 3 is covered with the first dielectric layer portion 6. The electronic component 4 is soldered and connected to the upper surface of each pad 9 by the solder 8. Accordingly, the electronic component 4 is mounted on each antenna pattern 3 via the pad 9.

A portion of the first dielectric layer portion 6 below the cavity 6a is formed between both antenna patterns 3, and the lower surface of the formed portion thereof is flush with the lower surface of each antenna pattern 3. The lower surface of the embedding portion 7a of the second dielectric layer portion 7 is in close contact with and fixed to the bottom surface of the cavity 6a and the upper surfaces of the pads 9.

The other components of the present embodiment are the same as those of the first embodiment, and thus are designated by the same reference signs, and the description thereof is omitted.

FIG. 7A to FIG. 10 are cross-sectional schematic diagrams showing a method for producing the high frequency circuit board 1 of the second embodiment. Hereinafter, the method for producing the high frequency circuit board 1 will be described with reference to FIG. 7A to FIG. 10. In the following description, the portion, on each antenna pattern 3, at which the pad 9 is provided is referred to as "one portion", and the portion, on each antenna pattern 3, at which the pad 9 is not provided is referred to "another portion".

Figure 7A:
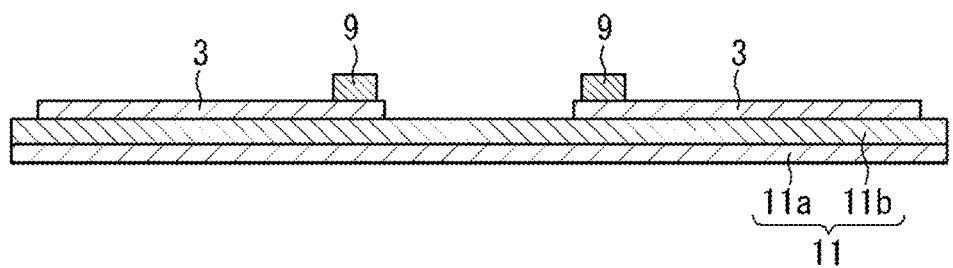
FIG. 7A is a cross-sectional schematic diagram showing a first step in a method for producing the high frequency circuit board in FIG. 6.

In FIG. 7A, first, etching is performed on a metal foil laminated on the upper surface of the provisional substrate 11, to form each antenna pattern 3. Thereafter, the pad 9 is provided at the one portion on each antenna pattern 3 (a first step).

Figure 7B:
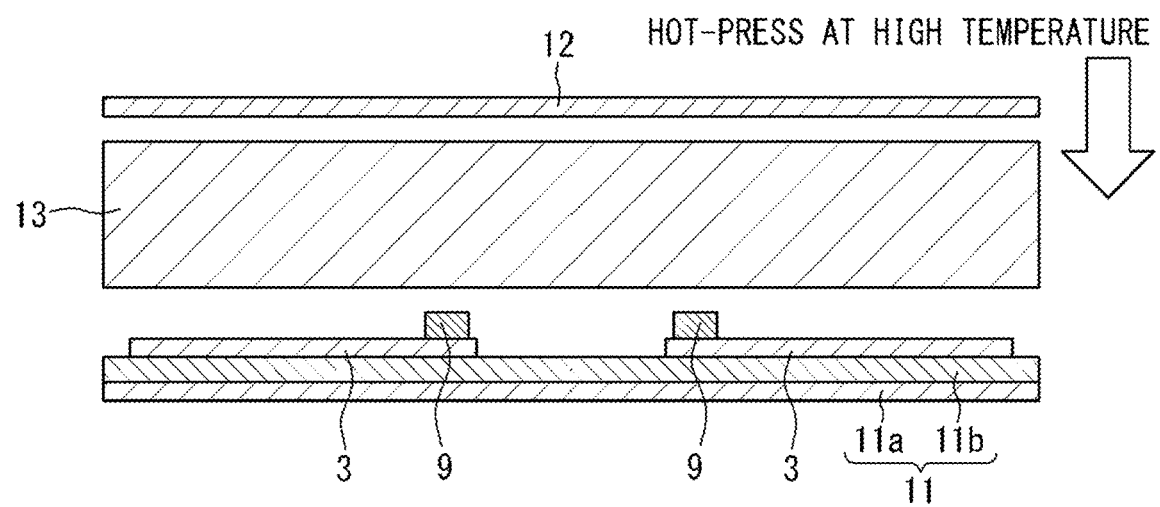
FIG. 7B is a cross-sectional schematic diagram showing a second step in the method for producing the high frequency circuit board in FIG. 6.

Next, as shown in FIG. 7B, in a state where the thermoplastic resin 13 and the provisional conductor 12 are stacked in this order on the upper surface of the provisional substrate 11, hot-press is performed at a high temperature of 350° C. or higher. Accordingly, as shown in FIG. 8A, between the provisional substrate 11 and the provisional conductor 12, the first dielectric layer portion 6 that covers the other portion on each antenna pattern 3 and the pads 9 is formed from the thermoplastic resin 13 (a second step).

Figure 8A:
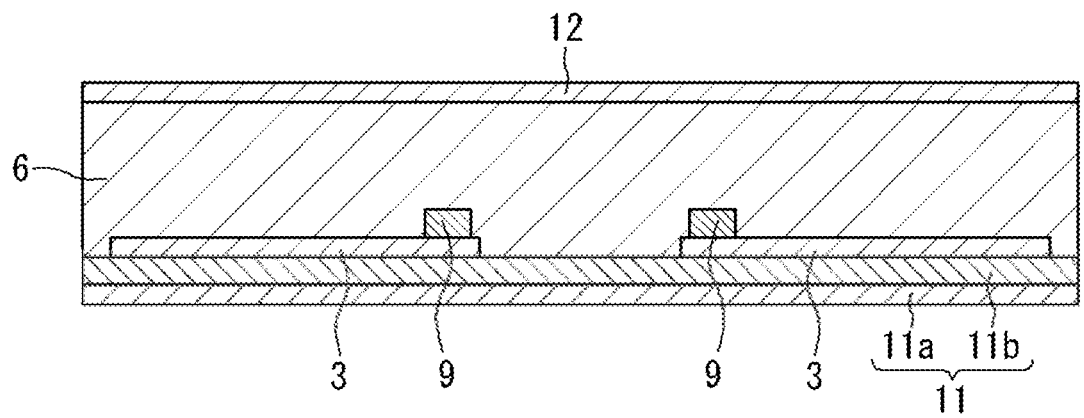
FIG. 8A is a cross-sectional schematic diagram showing the second step in the method for producing the high frequency circuit board in FIG. 6.
Figure 8B:
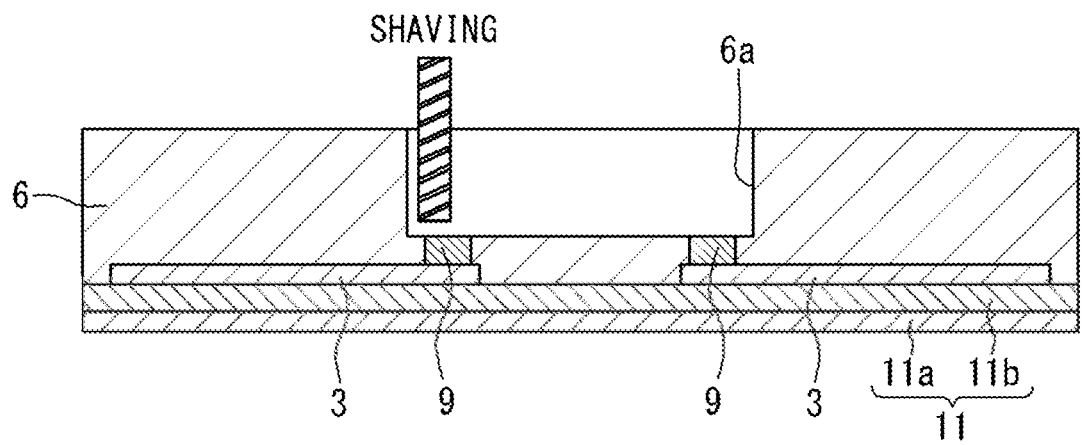
FIG. 8B is a cross-sectional schematic diagram showing a third step in the method for producing the high frequency circuit board in FIG. 6.

Next, after the provisional conductor 12 is removed in the state shown in FIG. 8A, shaving is performed on the first dielectric layer portion 6 as shown in FIG. 8B, to form the cavity 6a that allows the electronic component 4 to be housed therein (a third step). Accordingly, a state where the upper surface of each pad 9 is exposed at the bottom of the cavity 6a while the other portion of each antenna pattern 3 is kept covered with the first dielectric layer portion 6, is obtained.

Figure 9A:
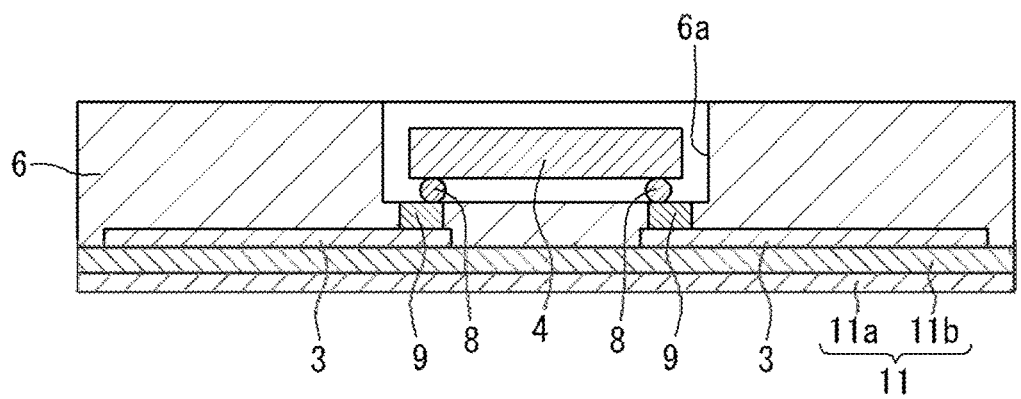
FIG. 9A is a cross-sectional schematic diagram showing a fourth step in the method for producing the high frequency circuit board in FIG. 6.

Next, as shown in FIG. 9A, in a state where the electronic component 4 is inserted into the cavity 6a of the first dielectric layer portion 6, the electronic component 4 is soldered to each pad 9 by the solder 8. Accordingly, the electronic component 4 is mounted on each antenna pattern 3 via the pad 9 in a state where the electronic component 4 is in non-contact with the first dielectric layer portion 6 (a fourth step).

Figure 9B:
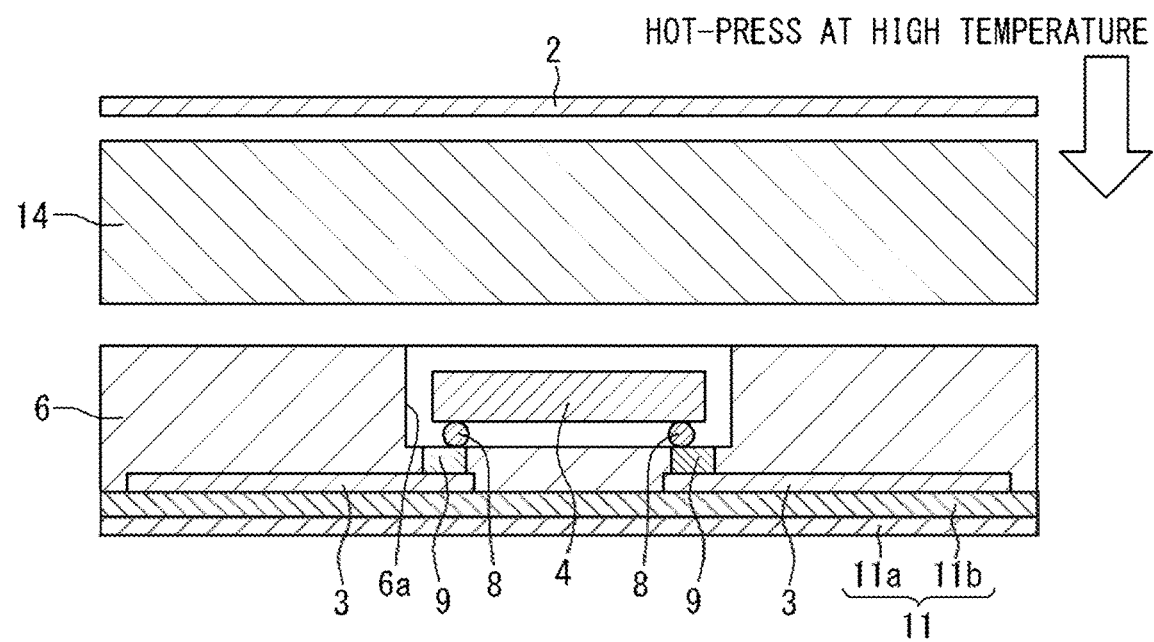
FIG. 9B is a cross-sectional schematic diagram showing a fifth step in the method for producing the high frequency circuit board in FIG. 6.

Next, as shown in FIG. 9B, in a state where the thermosetting resin 14 and the ground conductor 2 are stacked in this order at the opening side of the cavity 6a in the first dielectric layer portion 6, hot-press is performed at a low temperature of 220° C. (a fifth step). At this time, hot-press is performed such that a part of the thermosetting resin 14 is left between the upper surface 6b of the first dielectric layer portion 6 and the lower surface 2a of the ground conductor 2.

Figure 10:
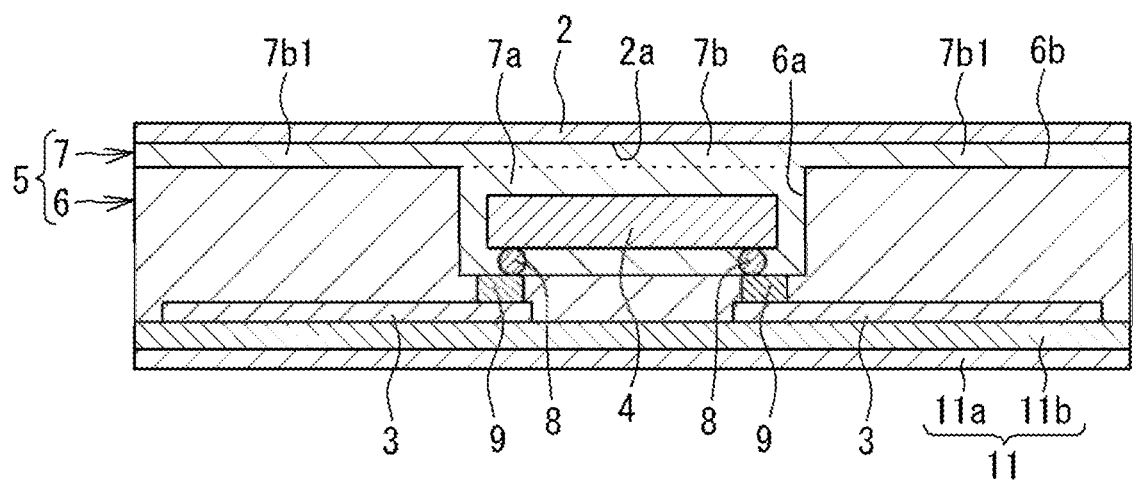
FIG. 10 is a cross-sectional schematic diagram showing the fifth step in the method for producing the high frequency circuit board in FIG. 6.

Accordingly, as shown in FIG. 10, the second dielectric layer portion 7 that has the embedding portion 7a in which the electronic component 4 in the cavity 6a is embedded and the close contact portion 7b interposed between the upper surface 6b of the first dielectric layer portion 6 and the lower surface 2a of the ground conductor 2 is formed from the thermosetting resin 14.

Next, the provisional substrate 11 is removed in the state shown in FIG. 10 (a sixth step). Accordingly, the high frequency circuit board 1 shown in FIG. 6 can be obtained.

Also with the above-described method for producing the high frequency circuit board 1 of the second embodiment, the same advantageous effects as those of the first embodiment are exhibited. In addition, even when shaving is performed on the first dielectric layer portion 6, the other portion on each antenna pattern 3 is kept covered with the first dielectric layer portion 6, and thus the area on the antenna pattern 3 that is covered with the first dielectric layer portion 6 can be increased as compared to that in the first embodiment. Thus, the high frequency characteristics can be further improved.

Moreover, since the portion of the first dielectric layer portion 6 below the cavity 6a is also formed between both antenna patterns 3, when hot-pressing the thermosetting resin 14 in the fifth step (see FIG. 9B) to form the second dielectric layer portion 7 in the cavity 6a, the amount of the thermosetting resin 14 caused to enter under the electronic component 4 can be reduced as compared to that in the first embodiment (see FIG. 4B). Thus, a gap in which the second dielectric layer portion 7 is not formed can be inhibited from occurring below the electronic component 4.

Third Embodiment

Figure 11:
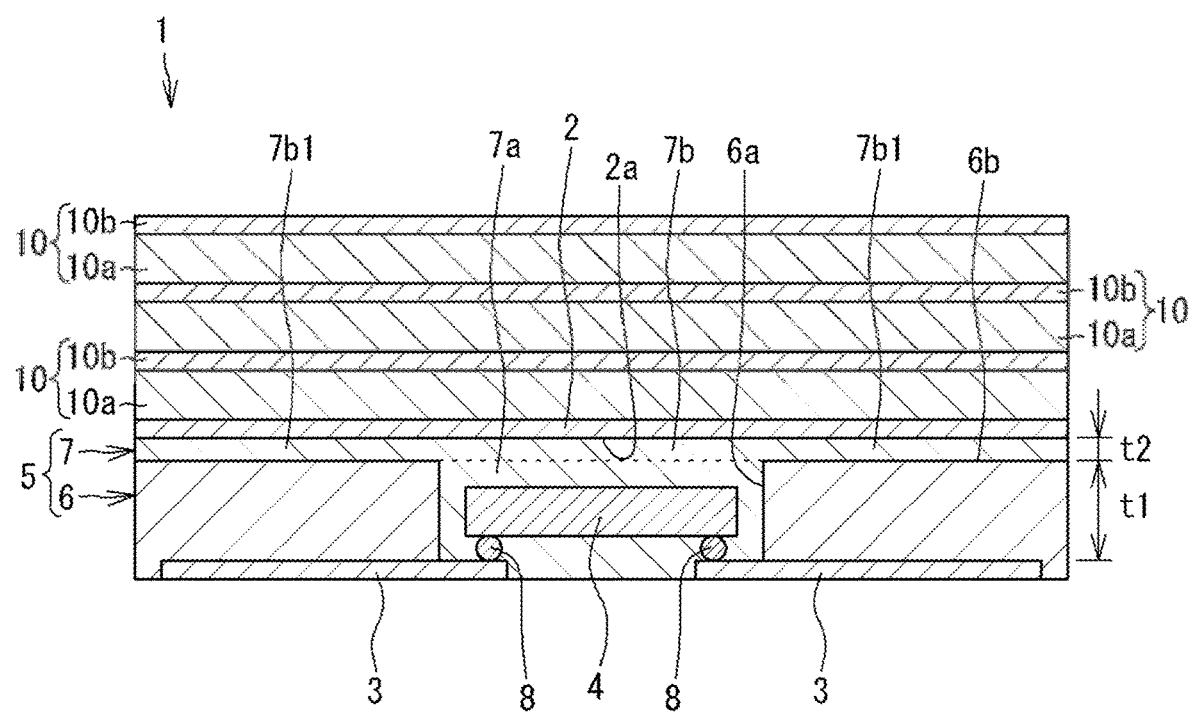
FIG. 11 is a cross-sectional schematic diagram showing a high frequency circuit board according to a third embodiment of the present invention.

FIG. 11 is a cross-sectional schematic diagram showing a high frequency circuit board according to a third embodiment of the present invention. The high frequency circuit board 1 of the present embodiment is a modification of the first embodiment, and includes a plurality of (three in the shown example) glass epoxy resin layers 10 laminated on the upper surface (other surface) of the ground conductor 2. Each of the glass epoxy resin layers 10 is formed, for example, by attaching a metal foil 10b such as a copper foil onto a substrate 10a formed from FR-4.

The other components of the present embodiment are the same as those of the first embodiment, and thus are designated by the same reference signs, and the description thereof is omitted.

It should be noted that only one glass epoxy resin layer 10 may be laminated. In addition, the glass epoxy resin layers 10 may be laminated on the upper surface of the ground conductor 2 of the second embodiment.

When producing the high frequency circuit board 1 of the present embodiment, first to sixth steps (see FIG. 2A to FIG. 5) are performed similar to the first embodiment, and then hot-press is performed in a state where the substrate 10a and the metal foil 10b are stacked in this order on the upper surface of the ground conductor 2. At this time, the temperature of the hot-press is about 200° C. and is lower than the melting temperature (350° C. or higher) of the first dielectric layer portion 6 (thermoplastic resin 13), and thus the first dielectric layer portion 6 is not melted due to the hot-press.

By repeatedly performing the step of hot-press, the high frequency circuit board 1 having the plurality of glass epoxy resin layers 10 laminated on the upper surface of the ground conductor 2 can be obtained.

Due to the above, also with the method for producing the high frequency circuit board 1 of the third embodiment, the same advantageous effects as those of the first embodiment are exhibited. In addition, since the high frequency circuit board 1 includes the glass epoxy resin layers 10, a circuit (a base band part circuit, a power supply, etc.) required for a radar sensor device can be disposed, and thus size reduction can be achieved.

[Others]

The high frequency circuit board of the present invention may be a high frequency circuit board for use in a device other than a radar sensor device.

The embodiments disclosed herein are merely illustrative and not restrictive in all aspects. The scope of the present disclosure is defined by the scope of the claims rather than the meaning described above, and is intended to include meaning equivalent to the scope of the claims and all modifications within the scope.

REFERENCE SIGNS LIST 1 high frequency circuit board
2 ground conductor
3 antenna pattern (high frequency circuit pattern)
4 electronic component
5 dielectric layer
6 first dielectric layer portion
6a cavity
7 second dielectric layer portion 9 pad
10 glass epoxy resin layer
11 provisional substrate
12 provisional conductor
13 thermoplastic resin
14 thermosetting resin
t1 thickness of first dielectric layer portion
t2 thickness of portion of second dielectric layer portion

The invention claimed is:

1. An extremely high frequency circuit board comprising:
a ground conductor;
an extremely high frequency circuit pattern disposed so as to be separated from one surface of the ground conductor;
an electronic component mounted on the extremely high frequency circuit pattern; and
a dielectric layer interposed between the ground conductor and the extremely high frequency circuit pattern, wherein
the dielectric layer has
a first dielectric layer portion having a cavity in which the electronic component is housed, the first dielectric layer portion being in non-contact with the electronic component, wherein the first dielectric layer portion is in close contact with and fixed to the extremely high frequency circuit pattern, and
a second dielectric layer portion that is formed at least in the cavity and in which the electronic component is embedded,
the first dielectric layer portion is formed from a thermoplastic resin, and
the second dielectric layer portion is formed from a thermosetting resin.

2. The extremely high frequency circuit board according to claim 1, wherein a part of the second dielectric layer portion is interposed between the ground conductor and a portion of the first dielectric layer portion excluding the cavity.

3. The extremely high frequency circuit board according to claim 2, wherein said part of the second dielectric layer portion has a thickness smaller than that of the first dielectric layer portion between the ground conductor and the extremely high frequency circuit pattern.

4. The extremely high frequency circuit board according to claim 1, wherein the thermoplastic resin is a polytetrafluoroethylene resin.

5. The extremely high frequency circuit board according to claim 1, wherein the extremely high frequency circuit pattern is an antenna pattern.

6. The extremely high frequency circuit board according to claim 1, further comprising a glass epoxy resin layer laminated on another surface of the ground conductor that is opposite to the one surface.

7. The extremely high frequency circuit board according to claim 1, wherein the electronic component is a monolithic microwave integrated circuit (MMIC).

8. The extremely high frequency circuit board according to claim 1, wherein the second dielectric portion includes an embedding portion that is fixed to an upper surface of the extremely high frequency circuit pattern.

* * * * *